US007956395B2

United States Patent
Inokuchi et al.

(10) Patent No.: US 7,956,395 B2
(45) Date of Patent: Jun. 7, 2011

(54) SPIN TRANSISTOR AND MAGNETIC MEMORY

(75) Inventors: Tomoaki Inokuchi, Kawasaki (JP);
Mizue Ishikawa, Yokohama (JP);
Hideyuki Sugiyama, Kawasaki (JP);
Yoshiaki Saito, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 12/200,169

(22) Filed: Aug. 28, 2008

(65) Prior Publication Data
US 2009/0059659 A1    Mar. 5, 2009

(30) Foreign Application Priority Data

Aug. 29, 2007   (JP) .................................. 2007-222836

(51) Int. Cl.
*H01L 27/115* (2006.01)
(52) U.S. Cl. ................................ 257/295; 257/E29.323
(58) Field of Classification Search .......... 257/295–296, 257/421, E29.323
See application file for complete search history.

(56) References Cited

U.S. PATENT DOCUMENTS

| | | | |
|---|---|---|---|
| 7,200,037 B2 | 4/2007 | Saito et al. | |
| 7,248,497 B2 | 7/2007 | Saito et al. | |
| 7,411,235 B2 | 8/2008 | Saito et al. | |
| 7,446,362 B2 * | 11/2008 | Hidaka et al. | 257/295 |
| 7,471,492 B2 * | 12/2008 | Fukuzawa et al. | 360/322 |
| 7,545,013 B2 * | 6/2009 | Sugahara et al. | 257/421 |
| 7,598,578 B2 * | 10/2009 | Nakamura et al. | 257/421 |
| 7,745,894 B2 * | 6/2010 | Asao et al. | 257/421 |
| 7,759,750 B2 * | 7/2010 | Hayakawa et al. | 257/421 |
| 2005/0282379 A1 * | 12/2005 | Saito et al. | 438/624 |
| 2006/0220161 A1 * | 10/2006 | Saito et al. | 257/421 |
| 2007/0164336 A1 | 7/2007 | Saito et al. | |
| 2007/0253120 A1 | 11/2007 | Saito et al. | |
| 2008/0061332 A1 | 3/2008 | Saito et al. | |
| 2009/0057793 A1 * | 3/2009 | Koga | 257/421 |

FOREIGN PATENT DOCUMENTS

| | | |
|---|---|---|
| JP | 2003-8105 | 1/2003 |
| JP | 2006-286726 | 10/2006 |

OTHER PUBLICATIONS

U.S. Appl. No. 12/234,082, filed Sep. 19, 2008, Tsuchiaki, et al.
U.S. Appl. No. 12/339,638, filed Dec. 19, 2008, Sugiyama, et al.
U.S. Appl. No. 12/342,383, filed Dec. 23, 2008, Ishikawa, et al.
Satoshi Sugahara, et al. "A Spin Metal-Oxide-Semiconductor Field-Effect Transistor Using Half-Metallic-Ferromagnet Contacts for the Source and Drain", Applied Physics Letters, vol. 84, No. 13, Mar. 29, 2004, pp. 2307-2309.

(Continued)

*Primary Examiner* — Nathan W Ha
(74) *Attorney, Agent, or Firm* — Oblon, Spivak, McClelland, Maier & Neustadt, L.L.P.

(57) ABSTRACT

A spin transistor includes a first ferromagnetic layer provided on a substrate and having an invariable magnetization direction, a second ferromagnetic layer provided on the substrate apart from the first ferromagnetic layer in a first direction, and having a variable magnetization direction, a plurality of projecting semiconductor layers provided on the substrate to extend in the first direction, and sandwiched between the first ferromagnetic layer and the second ferromagnetic layer, a plurality of channel regions respectively provided in the projecting semiconductor layers, and a gate electrode provided on the channel regions.

27 Claims, 9 Drawing Sheets

OTHER PUBLICATIONS

S. v Alfthan F. Boxberg, et al., "Electronic, Optical, and Structural Properties of Quantum Wire Superlattices on Vicinal (111) GaAs Substrates", Physical Review B 72, 045329, 2005, pp. 045329-1-045329-8.

U.S. Appl. No. 12/197,710, filed Aug. 25, 2008, Yoshiaki Saito, et al.

U.S. Appl. No. 12/194,797, filed Aug. 20, 2008, Mizue Ishikawa, et al.

U.S. Appl. No. 11/855,322, filed Sep. 14, 2007, Naoharu Sugiyama, et al.

U.S. Appl. No. 12/029,117, filed Feb. 11, 2008, Yoshiaki Saito, et al.

* cited by examiner

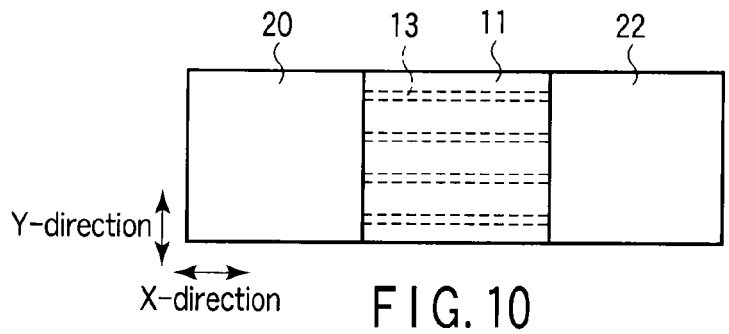
FIG. 10
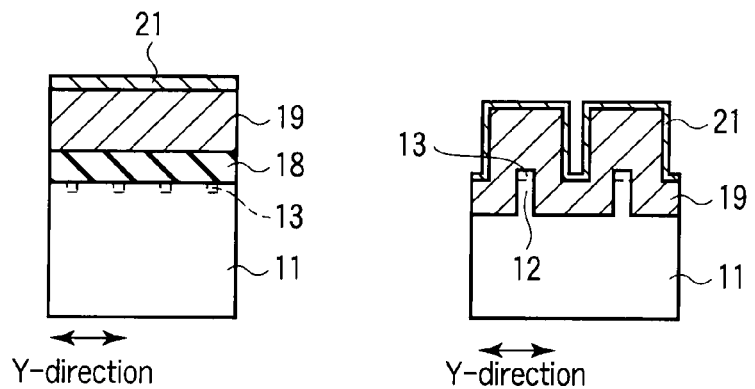
FIG. 11
FIG. 13
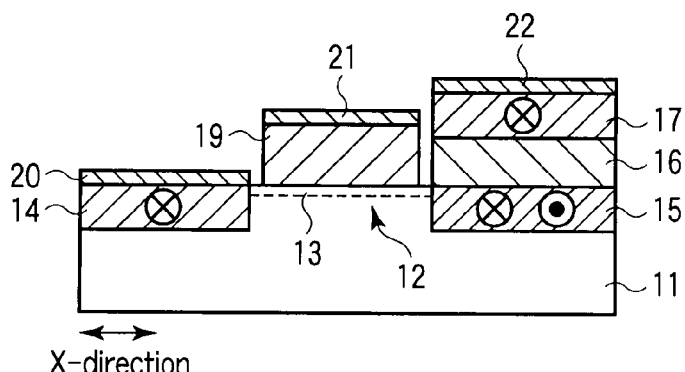
FIG. 12
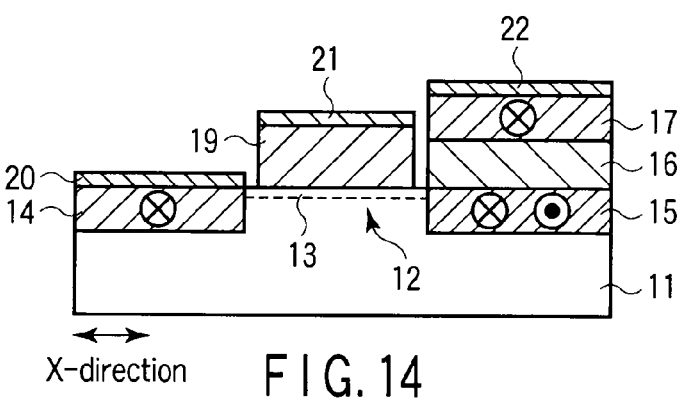
FIG. 14

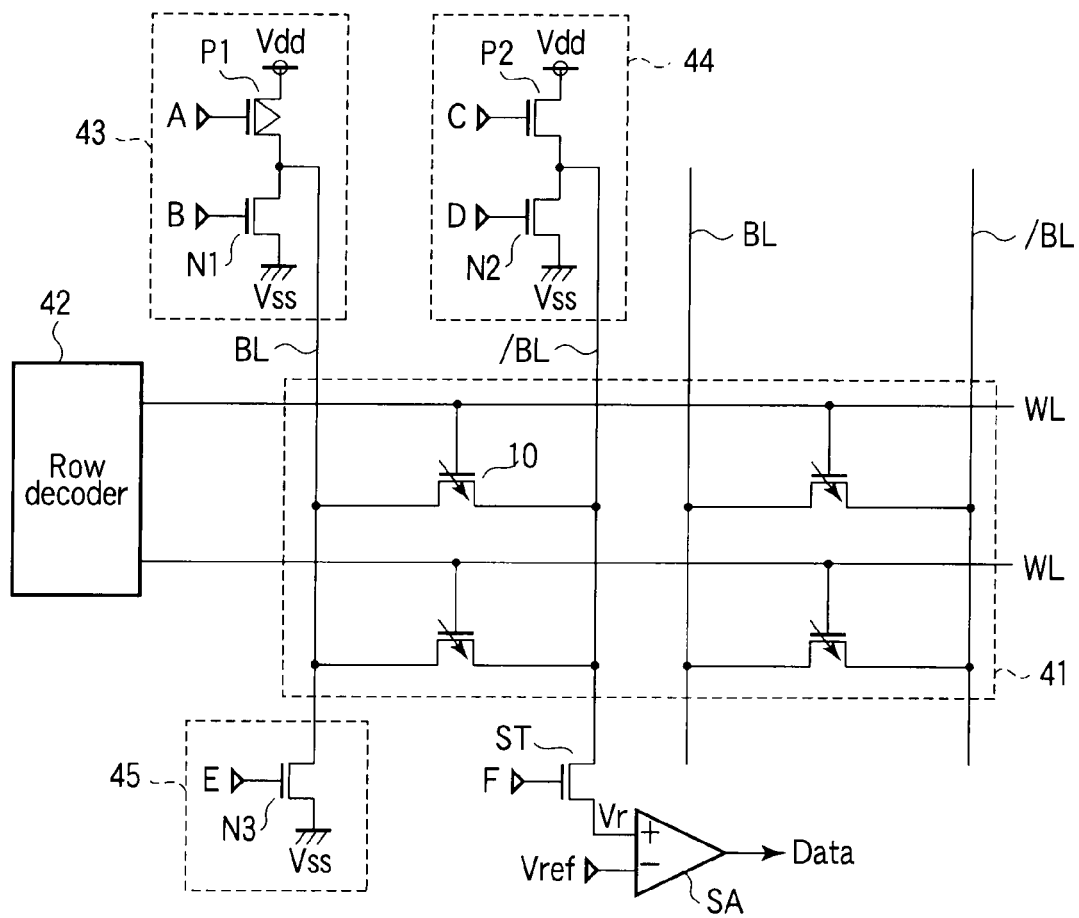
F I G. 28
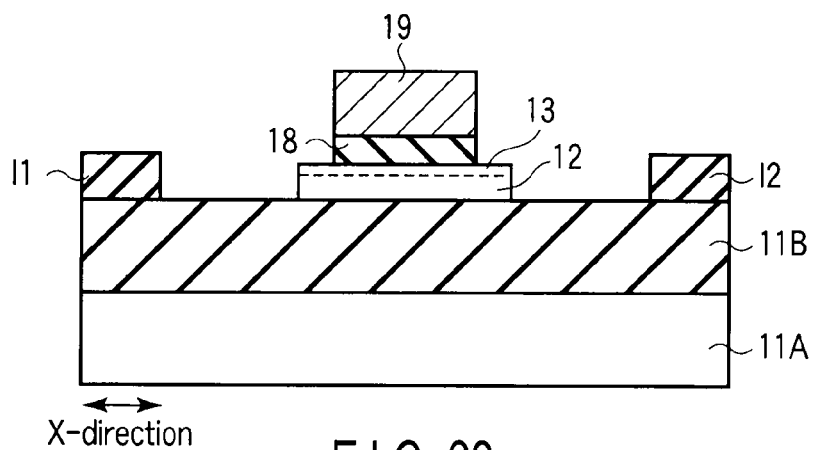
F I G. 29

SPIN TRANSISTOR AND MAGNETIC MEMORY

CROSS-REFERENCE TO RELATED APPLICATIONS

This application is based upon and claims the benefit of priority from prior Japanese Patent Application No. 2007-222836, filed Aug. 29, 2007, the entire contents of which are incorporated herein by reference.

BACKGROUND OF THE INVENTION

1. Field of the Invention

The present invention relates to a spin transistor and magnetic memory, e.g., a spin transistor having output characteristics depending on the spin direction of carriers, and a magnetic memory capable of recording information by using the spin transistor.

2. Description of the Related Art

Recently, new devices using the electric charge of electrons and the properties of spins at the same time are extensively researched. A spin transistor (also called a spin-transfer torque transistor or spin-filter transistor) as one of these devices is a transistor using a magnetic material as the source electrode and drain electrode, and capable of controlling the output characteristics by changing the relative magnetization directions in the source electrode and drain electrode (e.g., S. Sugahara and M. Tanaka, Appl. Phys. Lett. 84[2004]2307). That is, this transistor uses a phenomenon in which a drain current Id(P) increases when the relative magnetization directions in the source electrode and drain electrode are almost parallel, and a drain current Id(AP) decreases when the relative magnetization directions are almost antiparallel.

When using the spin transistor in a memory or reconfigurable logic circuit, it is necessary to increase the Id(P)/Id(AP) ratio, i.e., the difference between the drain current when the relative magnetization directions in the source electrode and drain electrode are almost parallel and that when the relative magnetization directions are almost antiparallel. To increase the Id(P)/Id(AP) ratio, it is necessary to, e.g., (1) increase the spin polarization ratio of the magnetic material used as the source electrode and drain electrode, (2) increase the efficiency of spin transfer to the semiconductor channel, or (3) suppress spin diffusion and spin relaxation in a semiconductor. Presently, spin diffusion and spin relaxation in a semiconductor are large, and this makes it impossible to secure a high Id(P)/Id(AP) ratio required for applications.

Note that it is also possible by adjusting the types of semiconductor and magnetic material to form a so-called inverse spin transistor in which the drain current Id(P) decreases when the relative magnetization directions in the source electrode and drain electrode are almost parallel, and the drain current Id(AP) increases when the relative magnetization directions are almost antiparallel. In this case, spin diffusion and spin relaxation in a semiconductor must be reduced in order to increase the Id(AP)/Id(P) ratio.

BRIEF SUMMARY OF THE INVENTION

According to an aspect of the present invention, there is provided a spin transistor comprising: a first ferromagnetic layer provided on a substrate and having an invariable magnetization direction; a second ferromagnetic layer provided on the substrate apart from the first ferromagnetic layer in a first direction, and having a variable magnetization direction; a plurality of projecting semiconductor layers provided on the substrate to extend in the first direction, and sandwiched between the first ferromagnetic layer and the second ferromagnetic layer; a plurality of channel regions respectively provided in the projecting semiconductor layers; and a gate electrode provided on the channel regions.

According to an aspect of the present invention, there is provided a spin transistor comprising: a first ferromagnetic layer provided on a substrate and having an invariable magnetization direction; a second ferromagnetic layer provided on the substrate apart from the first ferromagnetic layer in a first direction, and having a variable magnetization direction; a plurality of semiconductor layers provided on the substrate to extend in the first direction, sandwiched between the first ferromagnetic layer and the second ferromagnetic layer, and having upper surfaces inclined in a direction perpendicular to the first direction; a plurality of channel regions respectively provided in the semiconductor layers; and a gate electrode provided on the channel regions.

According to an aspect of the present invention, there is provided a spin transistor comprising: a first ferromagnetic layer provided in a semiconductor substrate and having an invariable magnetization direction; a second ferromagnetic layer provided in the semiconductor substrate apart from the first ferromagnetic layer in a first direction, and having a variable magnetization direction; a plurality of channel regions provided to extend in the first direction in the semiconductor substrate between the first ferromagnetic layer and the second ferromagnetic layer; and a gate electrode provided on the channel regions.

According to an aspect of the present invention, there is provided a magnetic memory comprising: one of the spin transistors according to the aspects; a first bit line electrically connected to the first ferromagnetic layer; a second bit line electrically connected to the second ferromagnetic layer; and a word line electrically connected to the gate electrode.

BRIEF DESCRIPTION OF THE SEVERAL VIEWS OF THE DRAWING

FIG. 10 is a plan view illustrating the structure of the spin transistor 10 shown in FIG. 9;

FIG. 11 is a sectional view of the spin transistor 10 when a channel region 13 shown in FIG. 9 is cut in the Y-direction;

FIG. 12 is a sectional view illustrating the structure of a spin transistor 10 according to the fourth embodiment;

FIG. 13 is a sectional view of the spin transistor 10 when a fin 12 shown in FIG. 12 is cut in the Y-direction;

FIG. 14 is a sectional view illustrating the structure of a spin transistor 10 according to the fifth embodiment;

FIG. 28 is a circuit diagram illustrating the arrangement of a magnetic memory according to the eleventh embodiment;

FIG. 29 is a sectional view illustrating a manufacturing step of the spin transistor 10 according to Example 1 of the present invention;

DETAILED DESCRIPTION OF THE INVENTION

Figure 1:
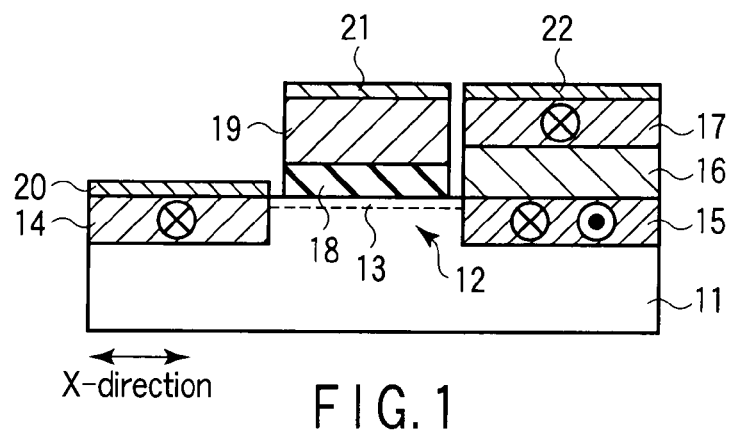
FIG. 1 is a sectional view illustrating the structure of a spin transistor 10 according to the first embodiment.

Embodiments of the present invention will be explained below with reference to the accompanying drawing. Note that in the following explanation, the same reference numerals denote elements having the same functions and arrangements, and a repetitive explanation will be made only when necessary.

First Embodiment

Figure 2:
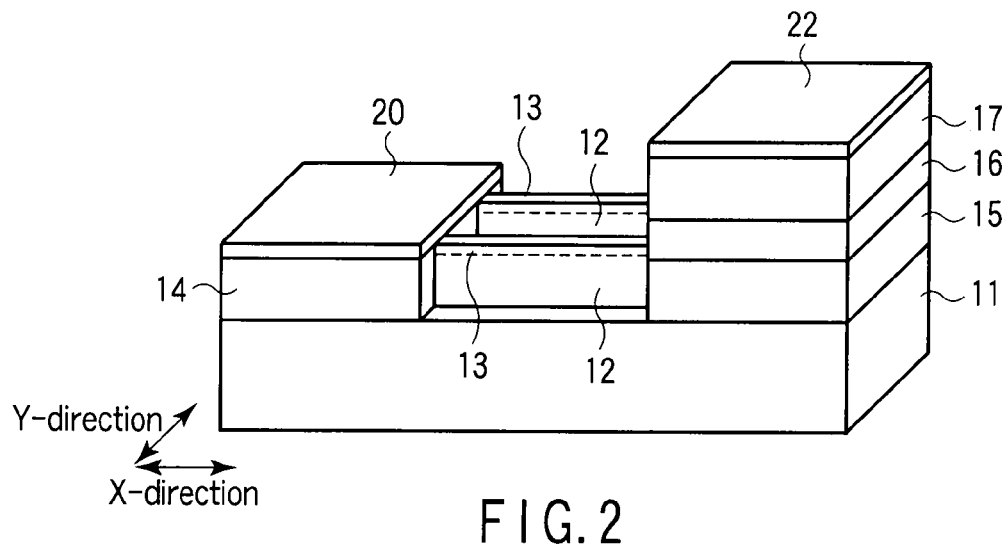
FIG. 2 is a perspective view illustrating the structure of the spin transistor 10 shown in FIG. 1.
Figure 3:
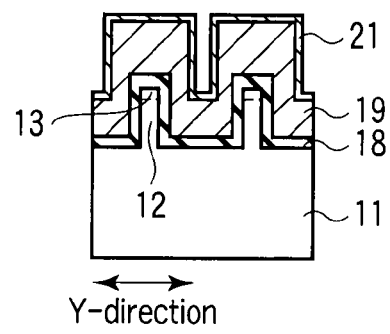
FIG. 3 is a sectional view of the spin transistor 10 when a projecting semiconductor layer (fin) 12 shown in FIG. 1 is cut in the Y-direction.

FIG. 1 is a sectional view illustrating the structure of a spin transistor 10 according to the first embodiment. FIG. 2 is a perspective view illustrating the structure of the spin transistor 10 shown in FIG. 1. FIG. 3 is a sectional view of the spin transistor 10 in which a projecting semiconductor layer (fin) 12 is cut in the Y-direction. Note that a gate electrode 19, gate insulating film 18, and electrode 21 are not shown in FIG. 2 in order to facilitate understanding of the structures of the fin 12 and a channel region 13. Note also that FIG. 1 is a sectional view in which the fin 12 shown in FIG. 2 is cut in the X-direction.

One or more projecting semiconductor layers (fins) 12 extending in the X-direction and having a projecting sectional shape in the Y-direction are formed on a semiconductor substrate 11. Each fin 12 is used as an active layer of the transistor. The number of the fins 12 is not particularly limited. This embodiment exemplarily shows two fins 12.

As the semiconductor substrate 11, it is possible to use:
(a) N- or P-type silicon (Si)
(b) Germanium (Ge) or $Si_xGe_{1-x}$ (0<x<1)
(c) a III-V or II-VI compound semiconductor
(d) a magnetic semiconductor The fins 12 may be made of the same material as that of the semiconductor substrate 11, or a material different from that of the semiconductor substrate 11. As the fins 12, materials (a) to (d) described above can be used.

Note that a silicon-on-insulator (SOI) substrate may also be used as the substrate. In this case, the fins 12 are formed in a semiconductor layer (SOI layer) formed on a buried insulating film (buried oxide [BOX] insulating layer). As the material of this SOI layer, any of the various semiconductors exemplified as the material of the semiconductor substrate 11 is used.

Each fin 12 has a channel region 13 as a carrier passage. The channel region 13 is formed by doping an impurity from the upper surface of the fin 12. It is also possible to use a method of forming a superlattice structure, or a hetero interface growing process using modulation doping.

On the two sides of the fins 12 on the semiconductor substrate 11, first and second ferromagnetic layers 14 and 15 are formed in contact with the fins 12. The first and second ferromagnetic layers 14 and 15 are electrically connected by the channel regions 13. A nonmagnetic layer 16 and third ferromagnetic layer 17 are sequentially formed on the second ferromagnetic layer 15.

Each of the first ferromagnetic layer (source electrode) 14 and third ferromagnetic layer 17 is a ferromagnetic material functioning as a magnetization fixed layer in which the magnetization direction is fixed in a predetermined direction (remains invariable). In other words, most electrons included in the first ferromagnetic layer 14 are spin-polarized in a predetermined direction. The magnetization directions in the first and third ferromagnetic layers 14 and 17 are established in, e.g., the same direction. However, these magnetization directions may also be established in opposite directions. Furthermore, the first and third ferromagnetic layers 14 and 17 desirably have unidirectional anisotropy.

The second ferromagnetic layer (drain electrode) 15 is a ferromagnetic material functioning as a magnetization recording layer. The magnetization direction in the second ferromagnetic layer 15 is variable in accordance with an externally applied magnetic field or spin transfer. The second ferromagnetic layer 15 desirably has uniaxial anisotropy. Note that the directions of easy magnetization in the first, second, and third ferromagnetic layers 14, 15, and 17 can be either parallel (in-plane magnetization) or perpendicular (perpendicular magnetization) to the film surfaces.

Since the magnetization direction in the second ferromagnetic layer 15 is variable, the magnetization direction in the second ferromagnetic layer 15 can be controlled to be "parallel" or "antiparallel" to that in the first ferromagnetic layer 14. "Parallel" to a certain magnetization direction means that the two magnetization directions are almost equal. "Antiparallel" to a certain magnetization direction means that the two magnetization directions are almost opposite. The expressions "parallel" and "antiparallel" conform to these definitions in the following explanation as well. Also, "the magnetization direction in the first ferromagnetic layer 14 remains invariable" means that the magnetization direction in the first ferromagnetic layer 14 does not change when a magnetization reversing current used to reverse the magnetization direction in the second ferromagnetic layer 15 is supplied to the first ferromagnetic layer 14.

A gate insulating film 18 is formed on the channel regions 13 and on the side surfaces of the fins 12. That is, the gate insulating film 18 is formed to cover the fins 12. A gate electrode 19 is formed on the gate insulating film 18 and its side surfaces. The gate insulating film 18 is made of, e.g., silicon oxide. The gate electrode 19 is made of, e.g., impurity-doped conductive polysilicon.

Electrodes 20, 21, and 22 also functioning as protective films are respectively formed on the first ferromagnetic layer 14, gate electrode 19, and third ferromagnetic layer 17. The electrodes 20 to 22 are made of, e.g., aluminum (Al).

The operation of the spin transistor 10 configured as above will be explained below. First, a voltage is applied between the electrodes 20 and 22, and a gate voltage greater than or equal to a threshold value is applied to the electrode 21 (i.e., the gate electrode 19). In this case, spin-polarized electrons enter each channel region 13 in accordance with the magnetization direction in the first ferromagnetic layer 14 on the source side.

A drain current Id when the voltage is applied between the electrodes 20 and 22 depends upon the magnitude of the voltage (gate voltage) applied to the electrode 21, and the relative magnetization directions in the first and second ferromagnetic layers 14 and 15. A channel current readily flows when the second ferromagnetic layer 15 is magnetized in the same direction as that of the first ferromagnetic layer 14, and hardly flows when the second ferromagnetic layer 15 is magnetized in the direction opposite to that of the first ferromagnetic layer 14.

As described above, the spin transistor 10 has the characteristic that the drain current Id changes in accordance with the relative magnetization directions in the first and second ferromagnetic layers 14 and 15. That is, a large drain current Id(P) flows when the relative magnetization directions in the first and second ferromagnetic layers 14 and 15 are almost parallel, and a drain current Id(AP) decreases when the relative magnetization directions are almost antiparallel. Accordingly, whether the magnetization direction in the second ferromagnetic layer 15 is almost parallel or antiparallel to that in the first ferromagnetic layer 14 can be specified by measuring the drain current Id between the electrodes 20 and 22 while the gate voltage greater than or equal to the threshold value is applied.

This means that the spin transistor 10 has a memory function. In particular, the second ferromagnetic layer 15 holds the magnetization direction unless energy is externally given by, e.g., a current-induced magnetic field or spin transfer. Therefore, the spin transistor 10 can achieve a nonvolatile memory function.

The higher the ratio (Id(P)/Id(AP) ratio) of the drain current Id(P) when the relative magnetization directions in the first and second ferromagnetic layers 14 and 15 are almost parallel to the drain current Id(AP) when the relative magnetization directions are almost antiparallel, the higher the performance of the spin transistor 10. The Id(P)/Id(AP) ratio depends on the spin polarization ratio in the ferromagnetic layer, the efficiency of spin transfer from the ferromagnetic layer to the channel region 13, and spin diffusion or spin relaxation in the channel region 13. Note that spin relaxation is the state in which the spins of electrons spin-polarized in a predetermined direction are relaxed, so the electrons cannot hold the spin information any longer.

If the width (channel width) of the channel region 13 is large, the transit angle of electrons entering the channel region 13 from the first ferromagnetic layer 14 becomes non-uniform, and spin relaxation caused by the Rashba effect increases. If spin relaxation increases, the spin information of electrons spin-polarized by the first ferromagnetic layer 14 is not transmitted to the second ferromagnetic layer 15. This decreases the Id(P)/Id(AP) ratio.

On the other hand, in this embodiment, the channel region 13 of the spin transistor 10 is formed in the fin 12. In addition, the width of the channel region 13 is decreased by decreasing the width (determined by the process limitations) of the fin 12, and the electron passage is made almost one-dimensional by decreasing the width of the channel region 13. Note that the width of each channel region 13 is preferably as small as possible in order to make the electron passage almost one-dimensional.

In the spin transistor 10 configured as above, the entrance angle of electrons from the first ferromagnetic layer 14 to the channel region 13 can be made almost zero. In this case, the direction of a magnetic field applied to the electrons by the Rashba effect is almost the same as that of the spins of the electrons, so no precession occurs in the spins. This makes it possible to suppress the spin relaxation of electrons. When the narrow channel as described above is used, a high Id(P)/Id(AP) ratio can be achieved by suppressing spin relaxation by the Rashba effect.

In this embodiment, a plurality of narrow channel regions 13 are formed parallel between the first and second ferromagnetic layers 14 and 15. The use of a plurality of narrow channel regions 13 has the advantage that a drive current necessary to change the magnetization direction in the second ferromagnetic layer 15 can be increased. This facilitates rewriting the magnetization direction in the second ferromagnetic layer 15 by using spin transfer. Note that the number of the fins 12 (i.e., the number of the channel regions 13) depends on the size of the spin transistor 10 and the magnitude of the desired drive current.

That is, if a desired drive current can be ensured by only one narrow channel region 13, it is possible to use only one channel region 13. Generally, however, a channel region having a width required to secure a desired drive current is divided into a plurality of channel regions, and these narrow channel regions are used.

Also, as shown in FIG. 1, the nonmagnetic layer 16 and the third ferromagnetic layer 17 in which the magnetization direction is fixed are sequentially formed on the second ferromagnetic layer 15. That is, the second ferromagnetic layer 15, nonmagnetic layer 16, and third ferromagnetic layer 17 form a magnetoresistive effect element. An electric current flowing through this magnetoresistive effect element also changes in accordance with the relative magnetization directions in the second and third ferromagnetic layers 15 and 17. Accordingly, the Id(P)/Id(AP) ratio of the spin transistor 10 can be further increased by adding the current change obtained by the magnetoresistive effect element.

The materials of the spin transistor 10 will be explained below.

As the ferromagnetic material used as the first, second, and third ferromagnetic layers 14, 15, and 17, it is possible to use:

(a) cobalt (Co), iron (Fe), nickel (Ni), or an alloy of any of these metals (b) an alloy such as Co—Pt, Co—Fe—Pt, Fe—Pt, Co—Fe—Cr—Pt, Co—Cr—Pt, Ni—Mn—Sb, Co$_2$MnGe, Co$_2$MnAl, Co$_2$MnSi, or CoCrFeAl (c) a magnetic semiconductor such as GeMn, SiCNi, SiCMn, SiCFe, ZnMnTe, ZnCrTe, BeMnTe, ZnVO, ZnMnO, ZnCoO, GaMnAg, InMnAs, InMnAb, GaMnP, GaMnN, GaCrN, AlCrN, BiFeTe, SbVTe, PbSnMnTe, GeMnTe, CdMnGeP, ZnSiNMn, ZnGeSiNMn, BeTiFeO, CdMnTe, ZnMnS, TiCoO, SiMn, or SiGeMn.

Note that the magnetic characteristics or the various physical properties such as the crystallinity, mechanical characteristics, and chemical characteristics can be adjusted by adding a nonmagnetic element to the above-mentioned magnetic material. Examples of the nonmagnetic element are silver (Ag), copper (Cu), gold (Au), aluminum (Al), ruthenium (Ru), osmium (Os), rhenium (Re), tantalum (Ta), boron (B), carbon (C), oxygen (O), nitrogen (N), palladium (Pd), platinum (Pt), zirconium (Zr), iridium (Ir), tungsten (W), molybdenum (Mo), and niobium (Nb).

Note also that the film thickness of each of the first, second, and third ferromagnetic layers 14, 15, and 17 is preferably 0.1 to 100 nm. In addition, the film thickness of each of these ferromagnetic layers must be a thickness that prevents superparamagnetism. When this condition is added, the film thickness is more preferably 0.4 nm or more.

As the nonmagnetic layer 16, it is possible to use:

(a) at least one element selected from the group consisting of copper (Cu), chromium (Cr), gold (Au), silver (Ag), hafnium (Hf), zirconium (Zr), rhodium (Rh), platinum (Pt), iridium (Ir), and aluminum (Al), or an alloy of these elements (b) an oxide or nitride of, e.g., silicon (Si), germanium (Ge), aluminum (Al), gallium (Ga), magnesium (Mg), or titanium (Ti)

(c) SrTiO, NdGaO, or $Si_xGe_{1-x}$ (0<x<1)

(d) a III-V or II-VI compound semiconductor (e) a magnetic semiconductor

In this embodiment as described in detail above, the fins 12 are formed between the first and second ferromagnetic layers 14 and 15, and the channel region 13 is formed in each fin 12. The width of the channel region 13 is decreased by decreasing the width of the fin 12. In other words, the width of each channel region 13 is decreased by dividing a channel having a desired width into a plurality of channel regions.

In this embodiment, therefore, the electron passage can be made almost one-dimensional, so spin relaxation can be suppressed. This makes it possible to increase the Id(P)/Id(AP) ratio.

Also, the gate electrode 19 is formed to cover the fins 12. Accordingly, the control of the spin transistor 10 by the gate voltage can be improved as in the conventional fin MOS transistor.

In addition, the nonmagnetic layer 16 and the third ferromagnetic layer 17 in which the magnetization direction is fixed are sequentially formed on the second ferromagnetic layer 15. Since this achieves the magnetoresistive effect between the second and third ferromagnetic layers 15 and 17 as well, the Id(P)/Id(AP) ratio can be further increased. Note that the nonmagnetic layer 16 and third ferromagnetic layer 17 are not always necessary. The first and second ferromagnetic layers 14 and 15 alone can well function as a spin transistor.

Figure 4:
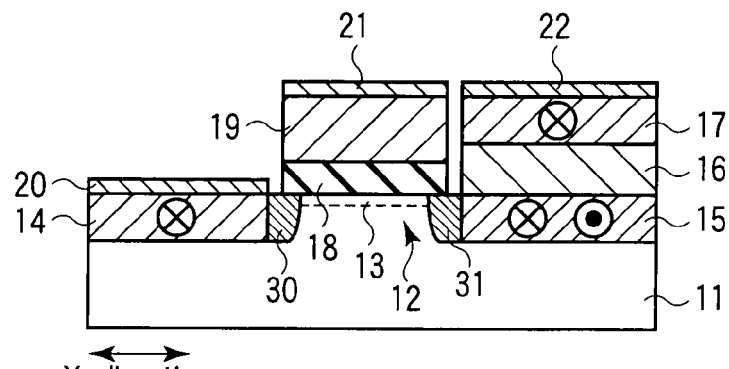
FIG. 4 is a sectional view illustrating the structure of a modification of the spin transistor 10.
Figure 5:
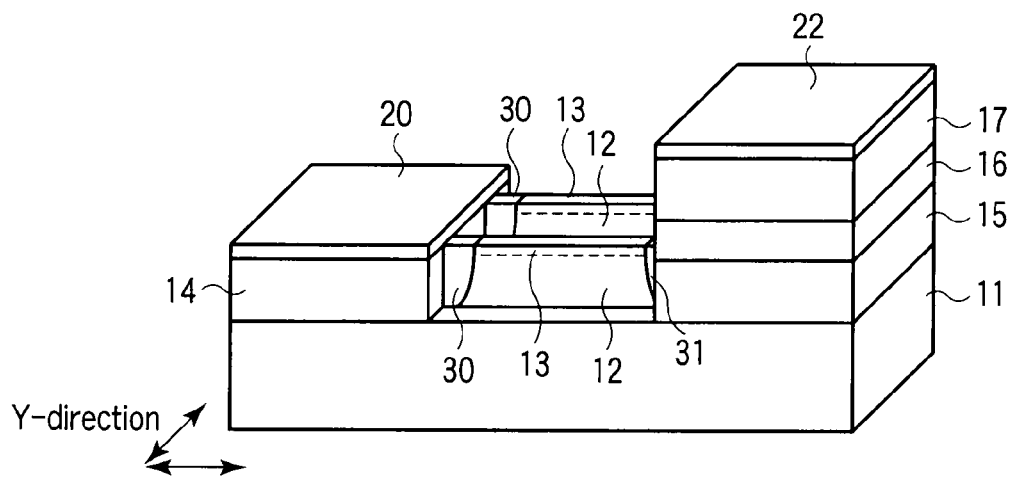
FIG. 5 is a perspective view illustrating the structure of the enhancement spin transistor 10 shown in FIG. 4.

Note that although FIGS. 1 to 3 illustrate a depletion-type spin transistor, it is of course also possible to use an enhancement-type spin transistor. FIG. 4 is a sectional view illustrating the structure of an enhancement-type spin transistor 10. FIG. 5 is a perspective view illustrating the structure of the enhancement-type spin transistor 10 shown in FIG. 4. Note that a gate electrode 19 and gate insulating film 18 are not shown in FIG. 5 in order to facilitate understanding the structure of a fin 12 and channel region 13.

A P-type channel region 13 is formed in the upper portion of each fin 12. The channel region 13 is formed by doping a P-type impurity (e.g., boron [B]) from the upper surface of the fin 12.

$N^+$-type diffusion regions 30 and 31 having the same depth as the film thickness of a first ferromagnetic layer 14 (or second ferromagnetic layer 15) are formed on the two end portions of the fin 12. The $N^+$-type diffusion regions 30 and 31 are formed to enter below the gate electrode 19 (to come into contact with the gate insulating film 18). The $N^+$-type diffusion layers 30 and 31 are formed by heavily doping an $N^+$-type impurity (e.g., phosphorus [P] or arsenic [As]) from the upper surface of the fin 12.

The first ferromagnetic layer 14 is in contact with the $N^+$-type diffusion layer 30. Likewise, the second ferromagnetic layer 15 is in contact with the $N^+$-type diffusion layer 31. Even when the channel structure of this embodiment is thus applied to the enhancement-type spin transistor, the same effects as those explained by using the depletion-type spin transistor can be obtained.

It is also possible to form diffusion regions 30 and 31 having the same conductivity type as that of the channel region 13 in the depletion-type spin transistor shown in FIGS. 1 to 3. This arrangement makes it possible to increase the drain current Id flowing between the first and second ferromagnetic layers 14 and 15.

Note that it is also possible by adjusting the types of semiconductor and magnetic material to form a so-called inverse spin transistor in which the drain current Id(P) decreases when the relative magnetization directions in the source electrode and drain electrode are almost parallel, and the drain current Id(AP) increases when the relative magnetization directions are almost antiparallel. The method of this embodiment can be used to increase the Id(AP)/Id(P) ratio in this case as well. This similarly applies to the following embodiments.

Second Embodiment

The second embodiment decreases the width of each channel region 13 by using an inclined step substrate having semiconductor layers 23 having inclined upper surfaces, and forming the channel region 13 in each semiconductor layer 23. Since electrons flow through the narrow channel region 13, spin relaxation is suppressed.

Figure 6:
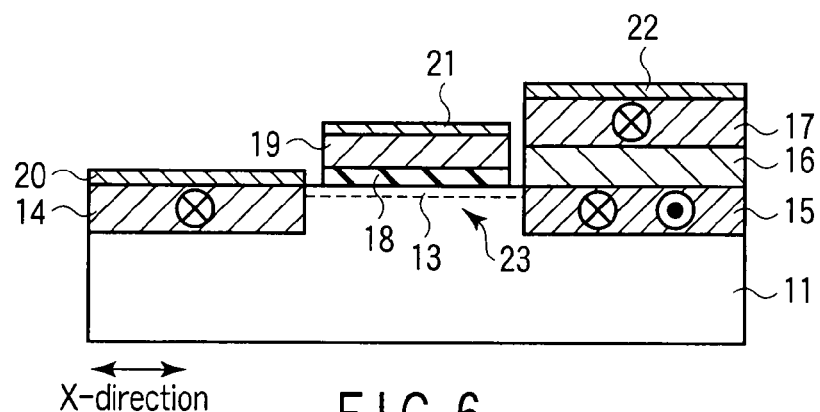
FIG. 6 is a sectional view illustrating the structure of a spin transistor 10 according to the second embodiment.
Figure 7:
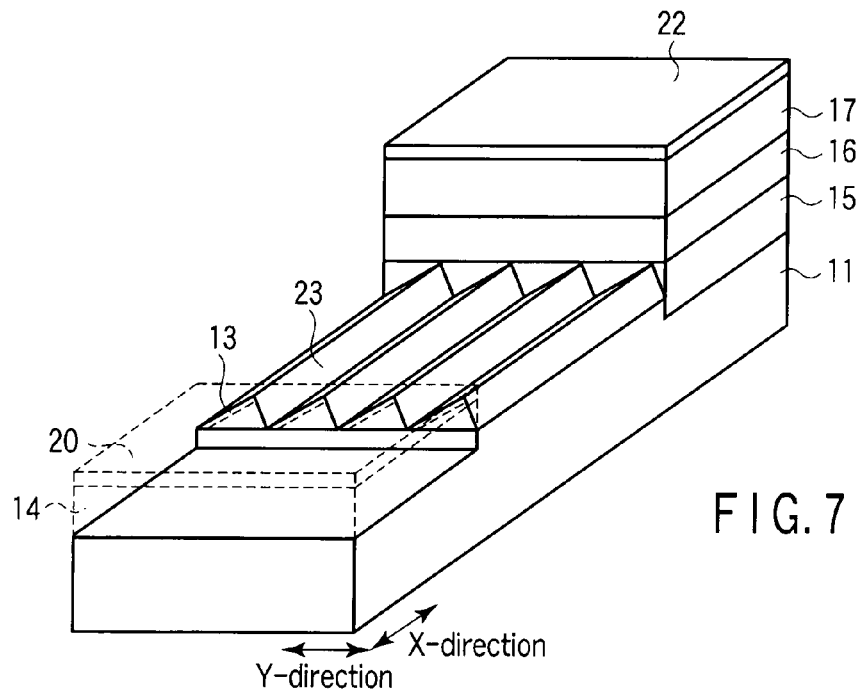
FIG. 7 is a perspective view illustrating the structure of the spin transistor 10 shown in FIG. 6.
Figure 8:
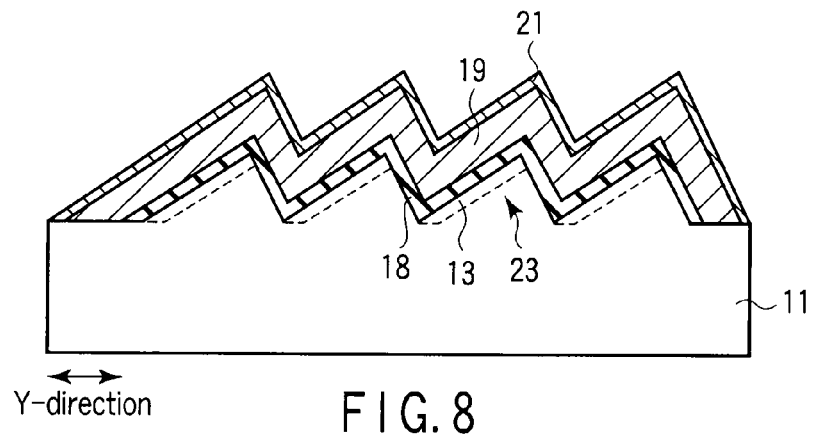
FIG. 8 is a sectional view of the spin transistor 10 when a semiconductor layer 23 shown in FIG. 6 is cut in the Y-direction.

FIG. 6 is a sectional view illustrating the structure of a spin transistor 10 according to the second embodiment. FIG. 7 is a perspective view illustrating the structure of the spin transistor 10 shown in FIG. 6. FIG. 8 is a sectional view of the spin transistor 10 in which the semiconductor layer 23 is cut in the Y-direction. Note that a gate electrode 19 and gate insulating film 18 are not shown in FIG. 7 in order to facilitate understanding the structure of the semiconductor layer 23 and channel region 13. Note also that FIG. 6 is a sectional view in which the semiconductor layer 23 shown in FIG. 7 is cut in the X-direction.

An inclined step substrate is used as a semiconductor substrate of this embodiment. That is, one or more semiconductor layers 23 extending in the X-direction, having an upper surface inclined to the Y-direction, and having a triangular sectional shape in the Y-direction are formed on a semiconductor substrate 11. Each semiconductor layer 23 is used as an active layer of the transistor. The number of the semiconductor layers 23 is not particularly limited. This embodiment exemplarily shows four semiconductor layers 23.

A channel region 13 as a carrier passage is formed in the upper portion corresponding to the inclined surface of each semiconductor layer 23. The channel region 13 is formed by using, e.g., a hetero interface growing process.

On the two sides of the semiconductor layers 23 on the semiconductor substrate 11, first and second ferromagnetic layers 14 and 15 are formed in contact with the semiconductor layers 23. The first and second ferromagnetic layers 14 and 15 are electrically connected by the channel regions 13. A nonmagnetic layer 16 and third ferromagnetic layer 17 are sequentially formed on the second ferromagnetic layer 15.

A gate insulating film 18 is formed on the channel regions 13 and on the side surfaces of the semiconductor layers 23. That is, the gate insulating film 18 is formed to cover the semiconductor layers 23. A gate electrode 19 is formed on the gate insulating film 18. Electrodes 20, 21, and 22 also functioning as protective films are respectively formed on the first ferromagnetic layer 14, gate electrode 19, and third ferromagnetic layer 17.

The width of the channel region 13 is decreased by decreasing the width (determined by the process limitations) of the inclined surface of each semiconductor layer 23, and the electron passage is made almost one-dimensional by decreasing the width of the channel region 13.

In the spin transistor 10 configured as above, the entrance angle of electrons from the first ferromagnetic layer 14 to the channel region 13 can be made almost zero. In this case, the direction of a magnetic field applied to the electrons by the Rashba effect is almost the same as that of the spins of the electrons, so no precession occurs in the spins. This makes it possible to suppress the spin relaxation of electrons. When the narrow channel as described above is used, a high Id(P)/Id(AP) ratio can be achieved by suppressing spin relaxation by the Rashba effect. Other effects are the same as in the first embodiment.

The channel structure of this embodiment is also applicable to an enhancement-type spin transistor. It is also possible to form diffusion regions 30 and 31 having the same conductivity type as that of the channel region 13 in the depletion-type spin transistor shown in FIGS. 6 to 8.

Third Embodiment

The third embodiment decreases the width of each channel region 13 by forming a plurality of channel regions 13 in a semiconductor substrate 11. Since electrons flow through the narrow channel region 13, spin relaxation is suppressed.

Figure 9:
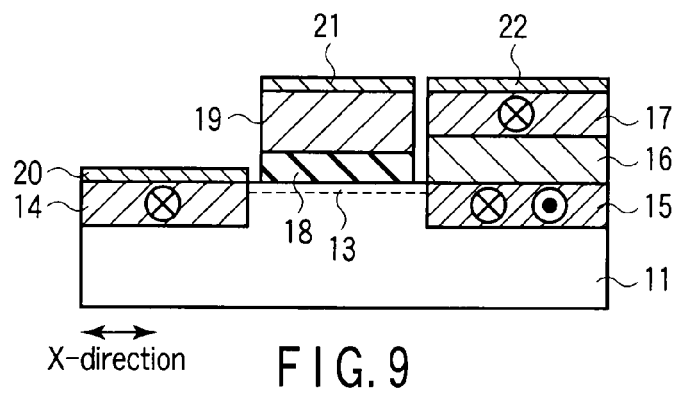
FIG. 9 is a sectional view illustrating the structure of a spin transistor 10 according to the third embodiment.

FIG. 9 is a sectional view illustrating the structure of the spin transistor 10 according to the third embodiment. FIG. 10 is a plan view illustrating the structure of the spin transistor 10 shown in FIG. 9. FIG. 11 is a sectional view of the spin transistor 10 in which the channel region 13 is cut in the Y-direction. Note that a gate electrode 19 and gate insulating film 18 are not shown in FIG. 10 in order to facilitate understanding the structure of the channel region 13. Note also that FIG. 9 is a sectional view in which the channel region 13 shown in FIG. 10 is cut in the X-direction.

A semiconductor substrate 11 has two openings spaced apart from each other. A first ferromagnetic layer 14 is formed in one opening. A second ferromagnetic layer 15 is formed in the other opening. A nonmagnetic layer 16 and third ferromagnetic layer 17 are sequentially formed on the second ferromagnetic layer 15.

Channel regions 13 extending in the X-direction are formed in the semiconductor substrate 11 between the first and second ferromagnetic layers 14 and 15. The number of the channel regions 13 is not particularly limited. This embodiment exemplarily shows four channel regions 13. The first and second ferromagnetic layers 14 and 15 are electrically connected by the channel regions 13. The channel regions 13 are formed by, e.g., doping an impurity into the semiconductor substrate 11.

A gate insulating film 18 is formed on the channel regions 13. A gate electrode 19 is formed on the gate insulating film 18. Electrodes 20, 21, and 22 also functioning as protective films are respectively formed on the first ferromagnetic layer 14, gate electrode 19, and third ferromagnetic layer 17.

The width of the channel region 13 is decreased in order to make the electron passage almost one-dimensional. In other words, the width of each channel region 13 is decreased by dividing a channel having a desired width into a plurality of channel regions.

In the spin transistor 10 configured as above, the entrance angle of electrons from the first ferromagnetic layer 14 to the channel region 13 can be made almost zero. This makes it possible to suppress the spin relaxation of electrons. When the narrow channel as described above is used, a high Id(P)/Id(AP) ratio can be achieved by suppressing spin relaxation by the Rashba effect. Other effects are the same as in the first embodiment.

The channel structure of this embodiment is also applicable to an enhancement-type spin transistor. It is also possible to form diffusion regions 30 and 31 having the same conductivity type as that of the channel region 13 in the depletion-type spin transistor shown in FIGS. 9 to 11.

Fourth Embodiment

The fourth embodiment is a modification of the first embodiment. In the fourth embodiment, a gate electrode 19 made of a conductor is directly formed on channel regions 13 in a spin transistor 10 having a fin structure. That is, the fourth embodiment is an example of the arrangement of a spin transistor 10 having a fin structure and metal semiconductor field effect transistor (MESFET) structure.

FIG. 12 is a sectional view illustrating the structure of the spin transistor 10 according to the fourth embodiment. FIG. 13 is a sectional view of the spin transistor 10 in which fins 12 are cut in the Y-direction. Note that a perspective view of the spin transistor 10 is the same as FIG. 2.

A gate electrode 19 is formed on the channel regions 13 and on the side surfaces of the fins 12. That is, the fins 12 and gate electrode 19 are in Schottky contact with each other. The gate electrode 19 is made of, e.g., a metal. The rest of the arrangement is the same as that of the spin transistor 10 exemplified in the first embodiment.

Even the spin transistor 10 using the MESFET structure as described above can operate in the same manner as in the first embodiment, and can achieve the same effects as in the first embodiment.

Note that this embodiment is also applicable to the second embodiment. That is, in the spin transistor 10 shown in FIG. 6, the gate electrode 19 made of a conductor is directly formed on the semiconductor layers 23, thereby bringing the semiconductor layers 23 and gate electrode 19 into Schottky contact with each other. Even a structure like this can operate in the same manner as in the second embodiment, and can achieve the same effects as in the second embodiment.

Furthermore, this embodiment can also be applied to the third embodiment. That is, in the spin transistor 10 shown in FIG. 9, the gate electrode 19 made of a conductor is directly formed on the semiconductor substrate 11, thereby bringing the semiconductor substrate 11 and gate electrode 19 into Schottky contact with each other. Even a structure like this can operate in the same manner as in the third embodiment, and can achieve the same effects as in the third embodiment.

Fifth Embodiment

The fifth embodiment is a modification of the first embodiment. In the fifth embodiment, a gate electrode 19 made of a semiconductor having a conductivity type opposite to that of channel regions 13 is formed on the channel regions 13 in a spin transistor 10 having a fin structure. That is, the fifth embodiment is an example of the arrangement of a spin transistor 10 having a fin structure and junction-gate FET (JFET) structure.

Figure 15:
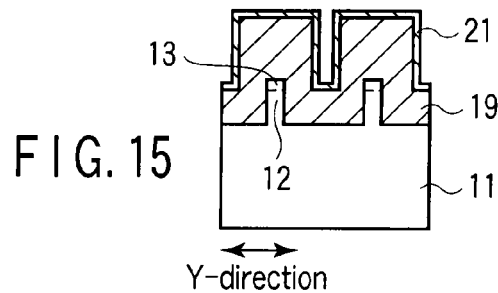
FIG. 15 is a sectional view of the spin transistor 10 when a fin 12 shown in FIG. 14 is cut in the Y-direction.

FIG. 14 is a sectional view illustrating the structure of the spin transistor 10 according to the fifth embodiment. FIG. 15 is a sectional view of the spin transistor 10 in which fins 12 are cut in the Y-direction. Note that a perspective view of the spin transistor 10 is the same as FIG. 2.

A gate electrode 19 is formed on the channel regions 13 and on the side surfaces of the fins 12. The gate electrode 19 is made of a semiconductor layer in which an impurity having a conductivity type opposite to that of the channel regions 13 is doped. The rest of the arrangement is the same as that of the spin transistor 10 exemplified in the first embodiment.

Even the spin transistor 10 using the JFET structure as described above can operate in the same manner as in the first embodiment, and can achieve the same effects as in the first embodiment.

Note that this embodiment is also applicable to the second embodiment. That is, in the spin transistor 10 shown in FIG. 6, the gate electrode 19 made of a semiconductor layer in which an impurity having a conductivity type opposite to that of the channel regions 13 is doped is formed on the semiconductor layers 23. Even a structure like this can operate in the same manner as in the second embodiment, and can achieve the same effects as in the second embodiment.

Furthermore, this embodiment can also be applied to the third embodiment. That is, in the spin transistor 10 shown in FIG. 9, the gate electrode 19 made of a semiconductor layer in which an impurity having a conductivity type opposite to that of the channel regions 13 is doped is formed on the semiconductor substrate 11. Even a structure like this can operate in the same manner as in the third embodiment, and can achieve the same effects as in the third embodiment.

Sixth Embodiment

The sixth embodiment is a modification of the first embodiment. In the sixth embodiment, antiferromagnetic layers for strongly fixing the magnetization directions in first and third ferromagnetic layers 14 and 17 in which the magnetization directions are fixed are stacked on the first and third ferromagnetic layers 14 and 17 in a spin transistor 10 having a fin structure.

Figure 16:
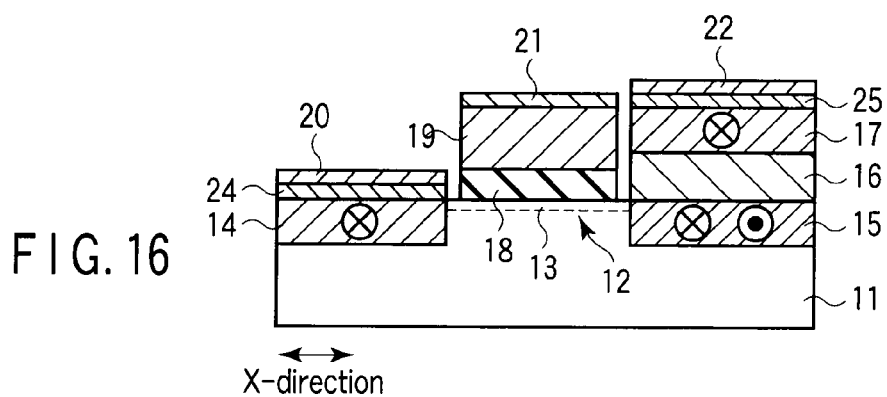
FIG. 16 is a sectional view illustrating the structure of a spin transistor 10 according to the sixth embodiment.
Figure 17:
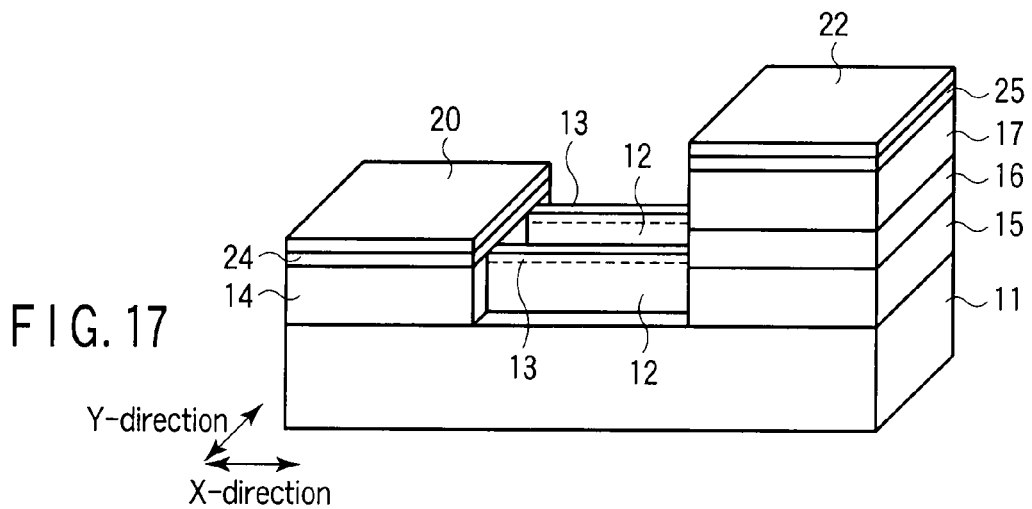
FIG. 17 is a perspective view illustrating the structure of the spin transistor 10 shown in FIG. 16.

FIG. 16 is a sectional view illustrating the structure of the spin transistor 10 according to the sixth embodiment. FIG. 17 is a perspective view illustrating the structure of the spin transistor 10 shown in FIG. 16. Note that a gate electrode 19 and gate insulating film 18 are not shown in FIG. 17 in order to facilitate understanding the structure of a fin 12 and channel region 13.

An antiferromagnetic layer 24 is formed on the first ferromagnetic layer 14. An electrode 20 is formed on the antiferromagnetic layer 24. The antiferromagnetic layer 24 is used to fix the magnetization direction in the first ferromagnetic layer 14. That is, exchange coupling between the first ferromagnetic layer 14 and antiferromagnetic layer 24 fixes magnetization of the first ferromagnetic layer 14 in one direction. At the same time, exchange coupling between the first ferromagnetic layer 14 and antiferromagnetic layer 24 gives the first ferromagnetic layer 14 a high magnetic anisotropic energy, thereby imparting the function of a magnetization fixed layer to the first ferromagnetic layer 14.

An antiferromagnetic layer 25 is formed on the third ferromagnetic layer 17. An electrode 22 is formed on the antiferromagnetic layer 25. The antiferromagnetic layer 25 is used to fix the magnetization direction in the third ferromagnetic layer 17. That is, exchange coupling between the third ferromagnetic layer 17 and antiferromagnetic layer 25 fixes magnetization of the third ferromagnetic layer 17 in one direction. At the same time, exchange coupling between the third ferromagnetic layer 17 and antiferromagnetic layer 25 gives the third ferromagnetic layer 17 a high magnetic anisotropic energy, thereby imparting the function of a magnetization fixed layer to the third ferromagnetic layer 17.

As the antiferromagnetic layers 24 and 25, it is possible to use, e.g., Fe—Mn, Pt—Mn, Pt—Cr—Mn, Ni—Mn, Ir—Mn, nickel oxide (NiO), or iron oxide ($Fe_2O_3$).

In the spin transistor 10 configured as above, the magnetization stability of the first and third ferromagnetic layers 14 and 17 can be obtained. This makes it possible to achieve a stable operation of the spin transistor 10.

Note that this embodiment is also applicable to the second embodiment. That is, in the spin transistor 10 shown in FIG. 6, the antiferromagnetic layers 24 and 25 are respectively stacked on the first and third ferromagnetic layers 14 and 17. As a consequence, the magnetization stability of the first and third ferromagnetic layers 14 and 17 can be obtained.

Furthermore, this embodiment can also be applied to the third embodiment. That is, in the spin transistor 10 shown in FIG. 9, the antiferromagnetic layers 24 and 25 are respectively stacked on the first and third ferromagnetic layers 14 and 17. Consequently, the magnetization stability of the first and third ferromagnetic layers 14 and 17 can be obtained.

Seventh Embodiment

The seventh embodiment is a modification of the first embodiment. In the seventh embodiment, a tunnel barrier layer is formed between a ferromagnetic layer and a semiconductor substrate (including fins). The tunnel barrier layer makes it possible to inject electrons in a channel region 13 at a high spin polarization ratio.

Figure 18:
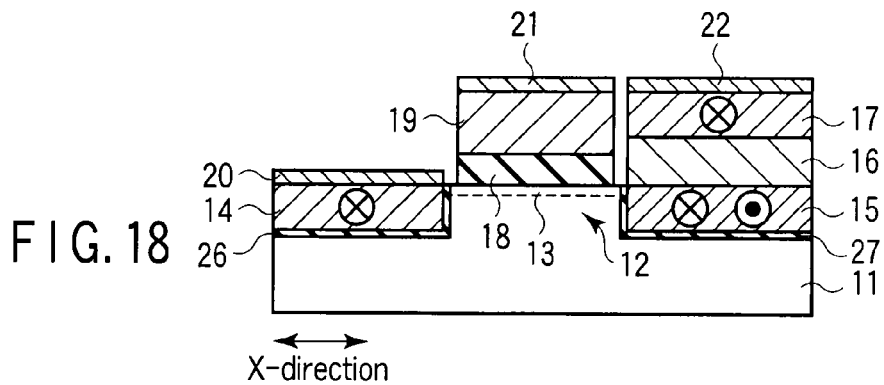
FIG. 18 is a sectional view illustrating the structure of a spin transistor 10 according to the seventh embodiment.
Figure 19:
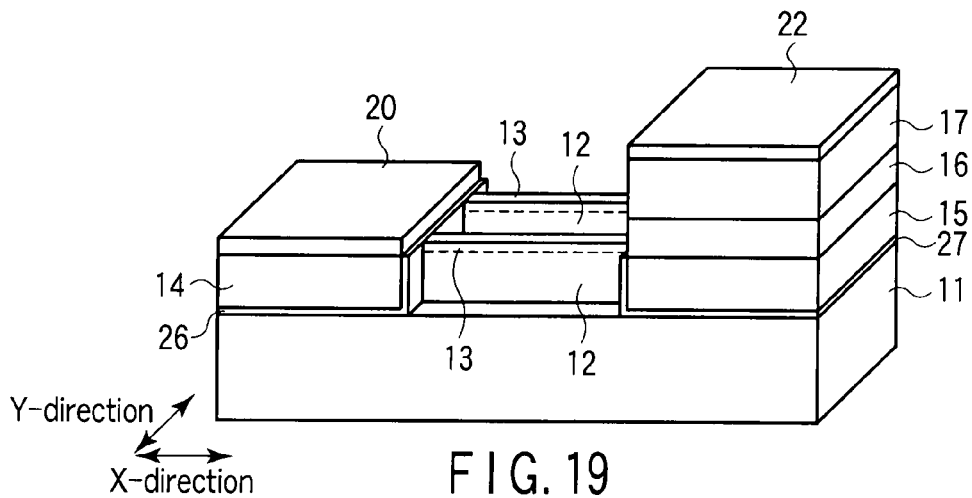
FIG. 19 is a perspective view illustrating the structure of the spin transistor 10 shown in FIG. 18.

FIG. 18 is a sectional view illustrating the structure of a spin transistor 10 according to the seventh embodiment. FIG. 19 is a perspective view illustrating the structure of the spin transistor 10 shown in FIG. 18. Note that a gate electrode 19 and gate insulating film 18 are not shown in FIG. 19 in order to facilitate understanding the structure of the fin 12 and channel region 13.

A tunnel barrier layer 26 is formed on the bottom and side surfaces of a first ferromagnetic layer 14. That is, the tunnel barrier layer 26 is formed between the first ferromagnetic layer 14 and fins 12. The tunnel barrier layer 26 is also formed between the first ferromagnetic layer 14 and a semiconductor substrate 11.

A tunnel barrier layer 27 is formed on the bottom and side surfaces of a second ferromagnetic layer 15. That is, the tunnel barrier layer 27 is formed between the second ferromagnetic layer 15 and fins 12. The tunnel barrier layer 27 is also formed between the second ferromagnetic layer 15 and semiconductor substrate 11.

As the tunnel barrier layers 26 and 27, it is possible to use:

(a) an oxide or nitride of, e.g., silicon (Si), germanium (Ge), aluminum (Al), gallium (Ga), magnesium (Mg), or titanium (Ti)

(b) SrTiO or NdGaO

In the spin transistor 10 configured as above, the tunnel barrier layers make it possible to inject electrons in the cannel regions 13 at a high spin polarization ratio. Consequently, it is possible to increase the change in conductance caused by the change in relative magnetization directions in the first and second ferromagnetic layers 14 and 15.

The tunnel barrier layer also prevents a reaction (e.g., inter-diffusion) that can occur between the surface of the semiconductor substrate 11 (or the surface of the fin 12) and the first ferromagnetic layer 14, or a reaction that can occur between the surface of the semiconductor substrate 11 (or the surface of the fine 12) and the second ferromagnetic layer 15. This makes it possible to well form a junction between the first ferromagnetic layer 14 and the surface of the semiconductor substrate 11, and a junction between the second ferromagnetic layer 15 and the surface of the semiconductor substrate 11, and increase the manufacturing yield of the spin transistor 10.

Note that the second to sixth embodiments are of course also applicable to this embodiment.

Eighth Embodiment

The eighth embodiment is a modification of the first embodiment. In the eighth embodiment, a first ferromagnetic layer 14 is formed on the source region of a MOS transistor having a fin structure, and a second ferromagnetic layer 15 is formed on the drain region of the MOS transistor. That is, the first and second ferromagnetic layers 14 and 15 are not formed on the two sides of fins 12 unlike in the first embodiment, but formed on the fins 12.

Figure 20:
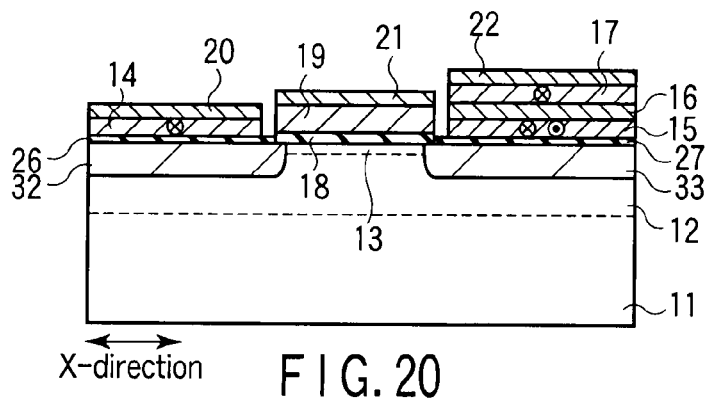
FIG. 20 is a sectional view illustrating the structure of a spin transistor 10 according to the eighth embodiment.
Figure 21:
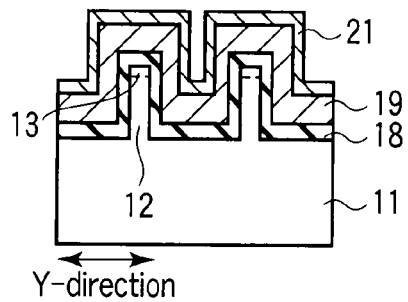
FIG. 21 is a sectional view when a channel region 13 of the spin transistor 10 shown in FIG. 20 is cut in the channel width direction.
Figure 22:
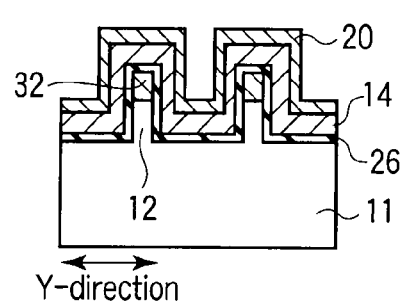
FIG. 22 is a sectional view when a source region 32 of the spin transistor 10 shown in FIG. 20 is cut in the channel width direction.

FIG. 20 is a sectional view illustrating the structure of a spin transistor 10 according to the eighth embodiment. FIG. 21 is a sectional view in which a channel region 13 of the spin transistor 10 shown in FIG. 20 is cut in the channel width direction. FIG. 22 is a sectional view in which a source region 32 of the spin transistor 10 shown in FIG. 20 is cut in the channel width direction.

On a semiconductor substrate 11, a plurality of, e.g., two fins 12 are formed to extend in the X-direction. A source region 32 and drain region 33 spaced apart from each other are formed in the upper portion of each fin 12. Note that the drain region 33 has the same shape as that of the source region 32 shown in FIG. 22. The source region 32 and drain region 33 are each made of an $N^+$-type diffusion region formed by heavily doping an $N^+$-type impurity (e.g., phosphorus [P] or arsenic [As]) from the upper surface of the fin 12.

A P-type channel region 13 is formed between the source region 32 and drain region 33 in the upper portion of the fin 12. A gate insulating film 18, gate electrode 19, and electrode 21 are sequentially stacked on the channel region 13.

A tunnel barrier layer 26, first ferromagnetic layer 14, and electrode 20 are sequentially stacked on the source region 32. A tunnel barrier layer 27, second ferromagnetic layer 15, nonmagnetic layer 16, third ferromagnetic layer 17, and electrode 22 are sequentially stacked on the drain region 33.

The same effects as in the first embodiment can be obtained even when the spin transistor 10 is configured as above. Note that the fourth to sixth embodiments can also be applied to this embodiment.

Ninth Embodiment

The ninth embodiment is a modification of the second embodiment. In the ninth embodiment, a MOS transistor is formed on an inclined step substrate, a first ferromagnetic layer 14 is formed on the source region of the MOS transistor, and a second ferromagnetic layer 15 is formed on the drain region of the MOS transistor.

Figure 23:
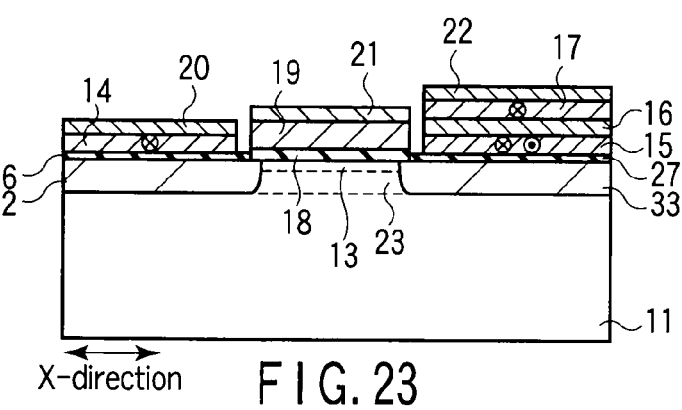
FIG. 23 is a sectional view illustrating the structure of a spin transistor 10 according to the ninth embodiment.
Figure 24:
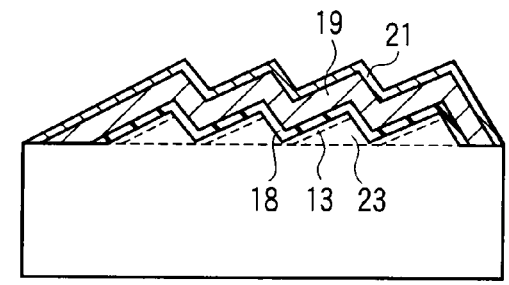
FIG. 24 is a sectional view when a channel region 13 of the spin transistor 10 shown in FIG. 23 is cut in the channel width direction.
Figure 25:
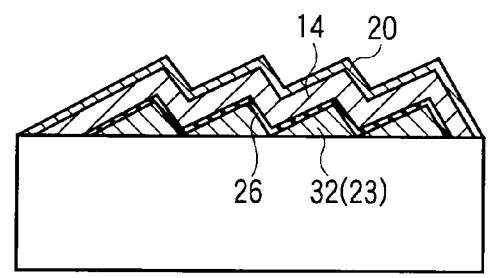
FIG. 25 is a sectional view when a source region 32 of the spin transistor 10 shown in FIG. 23 is cut in the channel width direction.

FIG. 23 is a sectional view illustrating the structure of a spin transistor 10 according to the ninth embodiment. FIG. 24 is a sectional view in which a channel region 13 of the spin transistor 10 shown in FIG. 23 is cut in the channel width direction. FIG. 25 is a sectional view in which a source region 32 of the spin transistor 10 shown in FIG. 23 is cut in the channel width direction.

An inclined step substrate 11 has, e.g., four semiconductor layers 23 extending in the X-direction and having inclined upper surfaces. A source region 32 and drain region 33 spaced apart from each other are formed in the upper portion corresponding to the inclined surface of each semiconductor layer 23. Note that the drain region 33 has the same shape as that of the source region 32 shown in FIG. 25. The source region 32 and drain region 33 are each made of an $N^+$-type diffusion region formed by heavily doping an $N^+$-type impurity (e.g., phosphorus [P] or arsenic [As]) from the inclined surface of the semiconductor layer 23.

A P-type channel region 13 is formed between the source region 32 and drain region 33 in the upper portion of the semiconductor layer 23. A gate insulating film 18, gate electrode 19, and electrode 21 are sequentially stacked on the channel region 13.

A tunnel barrier layer 26, first ferromagnetic layer 14, and electrode 20 are sequentially stacked on the source region 32. A tunnel barrier layer 27, second ferromagnetic layer 15, nonmagnetic layer 16, third ferromagnetic layer 17, and electrode 22 are sequentially stacked on the drain region 33.

The same effects as in the second embodiment can be obtained even when the spin transistor 10 is configured as above. Note that the fourth to sixth embodiments can also be applied to this embodiment.

Tenth Embodiment

The tenth embodiment is a modification of the third embodiment. In the tenth embodiment, a MOS transistor is formed on a semiconductor substrate, a first ferromagnetic layer 14 is formed on the source region of the MOS transistor, and a second ferromagnetic layer 15 is formed on the drain region of the MOS transistor.

Figure 26:
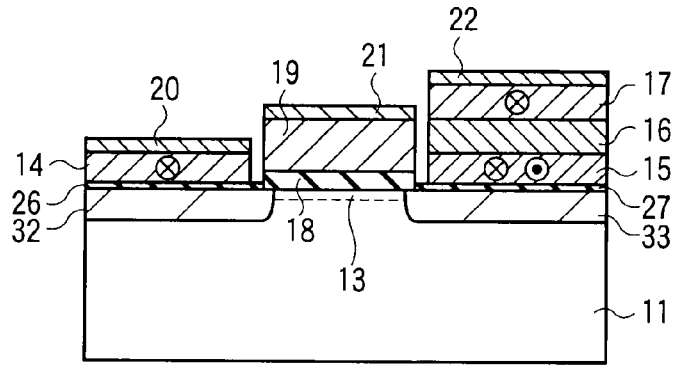
FIG. 26 is a sectional view illustrating the structure of a spin transistor 10 according to the tenth embodiment.
Figure 27:
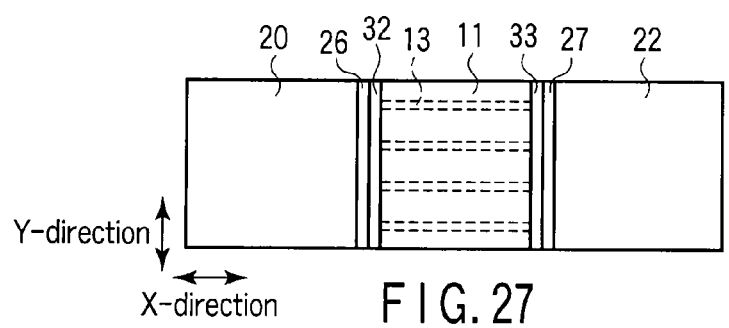
FIG. 27 is a plan view of the spin transistor 10 shown in FIG. 26.

FIG. 26 is a sectional view illustrating the structure of a spin transistor 10 according to the tenth embodiment. FIG. 27 is a plan view of the spin transistor 10 shown in FIG. 26. Note that a gate electrode 19 and gate insulating film 18 are not shown in FIG. 27 in order to facilitate understanding the structure of a channel region 13.

A source region 32 and drain region 33 spaced apart from each other are formed in a semiconductor substrate 11. The source region 32 and drain region 33 are each made of an $N^+$-type diffusion region formed by heavily doping an $N^+$-type impurity (e.g., phosphorus [P] or arsenic [As]) in the semiconductor substrate 11.

In the semiconductor substrate 11 between the source region 32 and drain region 33, a plurality of, e.g., four P-type channel regions 13 are formed to extend in the X-direction. A gate insulating film 18, gate electrode 19, and electrode 21 are sequentially stacked on the channel regions 13.

A tunnel barrier layer 26, first ferromagnetic layer 14, and electrode 20 are sequentially stacked on the source region 32. A tunnel barrier layer 27, second ferromagnetic layer 15, nonmagnetic layer 16, third ferromagnetic layer 17, and electrode 22 are sequentially stacked on the drain region 33.

The same effects as in the third embodiment can be obtained even when the spin transistor 10 is configured as above. Note that the fourth to sixth embodiments can also be applied to this embodiment.

Eleventh Embodiment

The eleventh embodiment is an example of the arrangement of a magnetic memory using spin transistors 10. FIG. 28 is a circuit diagram illustrating the arrangement of the magnetic memory according to the eleventh embodiment.

A memory cell array 41 is formed by arranging the spin transistors 10 in a matrix. Each spin transistor 10 forms a memory cell as a data storage unit. Any of the spin transistors 10 exemplified in the first to tenth embodiments is used as the spin transistor 10 showing in FIG. 28.

More specifically, a second ferromagnetic layer 15 in which the magnetization direction is variable is used as a storage portion, and data is stored as the magnetization direction of the second ferromagnetic layer 15. The spin transistor 10 can be used as a memory cell by reading the data by using the magnetoresistive effect occurring between a first ferromagnetic layer 14 in which the magnetization direction is invariable and the second ferromagnetic layer 15 in which the magnetization direction is variable.

The drains of the spin transistors 10 are electrically connected to bit lines BL running in the column direction. The sources of the spin transistors 10 are electrically connected to bit lines/BL running in the column direction.

A CMOS type first power supply circuit 43 is connected to one end of each bit line BL. The first power supply circuit 43 comprises a P-channel MOS transistor P1 and N-channel MOS transistor N1 connected in series. The source of the MOS transistor P1 is connected to a power supply terminal Vdd. The source of the MOS transistor N1 is connected to a ground terminal Vss. The bit line BL is connected to the connection point of the MOS transistors P1 and N1. A control signal A is input to the gate of the MOS transistor P1. A control signal B is input to the gate of the MOS transistor N1.

A CMOS type second power supply circuit 44 is connected to one end of the bit line/BL. The second power supply circuit 44 comprises a P-channel MOS transistor P2 and N-channel MOS transistor N2 connected in series. The source of the MOS transistor P2 is connected to a power supply terminal Vdd. The source of the MOS transistor N2 is connected to a ground terminal Vss. The bit line/BL is connected to the connection point of the MOS transistors P2 and N2. A control signal C is input to the gate of the MOS transistor P2. A control signal D is input to the gate of the MOS transistor N2.

A third power supply circuit 45 is connected to the other end of the bit line BL. The third power supply circuit 45 comprises an N-channel MOS transistor N3. The source of the MOS transistor N3 is connected to a ground terminal Vss. The drain of the MOS transistor N3 is connected to the bit line BL. A control signal E that goes high when reading data is input to the gate of the MOS transistor N3.

A sense amplifier SA is connected to the other end of the bit line/BL via an N-channel MOS transistor ST as a column selection switch. The sense amplifier SA comprises, e.g., a differential amplifier, and determines data stored in the spin transistor 10 on the basis of a read voltage Vr of the bit line/BL and a reference voltage Vref. The output signal from the sense amplifier SA is read data from a selected spin transistor 10. A column selection signal F supplied from a column decoder (not shown) is input to the gate of the MOS transistor ST.

The gates of the spin transistors 10 are connected to word lines WL. The word lines WL are connected to a row decoder 42. The row decoder 42 controls the turning on/off of the spin transistors 10 via the word lines WL.

The operation of the magnetic memory configured as above will be explained below. First, an operation of writing data to the spin transistor 10 will be explained.

When writing binary 0 to the spin transistor 10, a gate voltage that turns on the spin transistor 10 is applied to a selected word line WL. In addition, the control signals A and B are made high, and the control signals C and D are made low. Consequently, a spin transfer current flows through the spin transistor 10 from the first power supply circuit 43 to the second power supply circuit 44. Note that in this embodiment, an electric current is the flow of electrons.

On the other hand, when writing binary 1 to the spin transistor 10, a gate voltage that turns on the spin transistor 10 is applied to a selected word line WL. In addition, the control signals A and B are made low, and the control signals C and D are made high. Consequently, a spin transfer current flows through the spin transistor 10 from the second power supply circuit 44 to the first power supply circuit 43. Note that when writing data, the third power supply circuit 45 and sense amplifier SA are deactivated. In this manner, binary 0 or 1 can be written to the spin transistor 10.

An operation of reading data from the spin transistor 10 will now be explained. When reading data, a gate voltage that turns on the spin transistor 10 is applied to a selected word line WL, and the control signal E and column selection signal F are made high. As a consequence, a read current flows from the third power supply circuit 45 to the sense amplifier SA via the spin transistor 10. The sense amplifier SA outputs the data by comparing the read potential Vr with the reference potential Vref.

Note that when reading data, the first and second power supply circuits 43 and 44 are deactivated. Note also that the read current is made smaller than the spin transfer current, thereby preventing a write error during data read. In this way, data stored in the spin transistor 10 can be read.

In this embodiment as described in detail above, a magnetic memory can be formed by using any of the spin transistors 10 exemplified in the first to tenth embodiments. It is also possible to facilitate the arrangement of a memory cell array because a memory cell as a data storage unit can be formed by only one spin transistor 10.

Example 1

Figure 30:
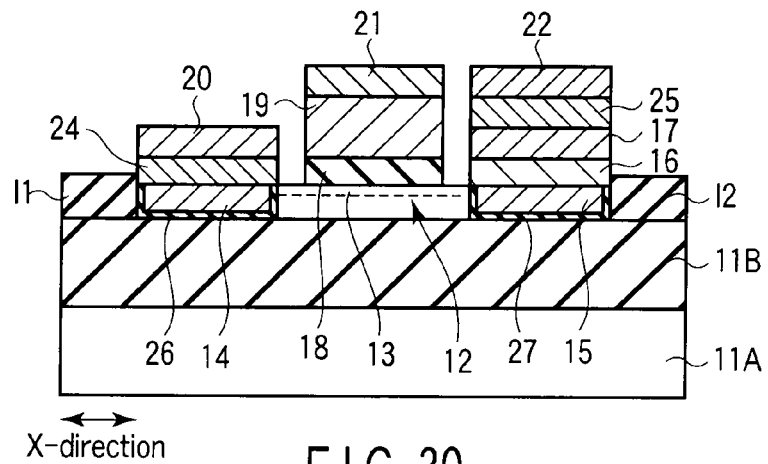
FIG. 30 is a sectional view illustrating a manufacturing step, which follows FIG. 29, of the spin transistor 10.

A practical example of the spin transistor 10 having a fin structure exemplified in the first embodiment will be explained below. In this example, a spin transistor was manufactured by adding antiferromagnetic layers 24 and 25 and tunnel barrier layers 26 and 27 to the spin transistor 10 having a fin structure exemplified in the first embodiment. FIGS. 29 and 30 are sectional views illustrating manufacturing steps of the spin transistor 10 according to Example 1.

As shown in FIG. 29, an SOI substrate formed by sequentially stacking a substrate 11A, BOX insulating layer 11B, and SOI layer was prepared, and element isolation insulating layers 11 and 12 and an active layer were formed on the BOX insulating layer 11B by using the conventional CMOS process.

Then, an insulating film was deposited on the active layer by chemical vapor deposition (CVD), and patterned by photolithography. After a resist layer was removed, the insulating film was used as a hard mask to etch the active layer by reactive ion etching (RIE), thereby forming fins 12 on the BOX insulating layer 11B.

Subsequently, a channel region 13 as a carrier passage was formed in each fin 12 by ion-implanting an impurity in the fin 12.

A gate insulating film 18 was formed on the exposed surface of each fin 12 by thermal oxidation. A metal layer serving as a gate electrode 19 was deposited on the gate insulating film 18 by sputtering or CVD. A gate electrode 19 was formed by patterning the metal layer by photolithography.

As shown in FIG. 30, $SiO_2$ layers serving as tunnel barrier layers 26 and 27 were formed on the two end portions of the fin 12. Co—Fe (3 nm) and Ta (5 nm) serving as first and second ferromagnetic layers 14 and 15 were respectively deposited on the tunnel barrier layers 26 and 27.

After a region except for the first ferromagnetic layer 14 was protected by a resist layer, the Ta layer on the first ferromagnetic layer 14 was removed. Pt—Mn (20 nm) serving as an antiferromagnetic layer 24 and Al serving as an electrode 20 were sequentially deposited on the first ferromagnetic layer 14. After that, the Pt—Mn layer and Al layer in portions except for the necessary portion were removed. Note that a chamber for removing the Ta layer and a chamber for performing the Pt—Mn layer formation process were connected via a transfer chamber, so a sample could be moved while it was kept in a vacuum. Note also that the first ferromagnetic layer 14 and antiferromagnetic layer 24 are desirably formed by using a sputtering apparatus having a high directivity.

After a region except for the second ferromagnetic layer 15 was protected by a resist layer, the Ta layer on the second ferromagnetic layer 15 was removed. Cu as a nonmagnetic layer 16, $Co_{90}Fe_{10}$ as a third ferromagnetic layer 17, Pt—Mn (20 nm) as an antiferromagnetic layer 25, and Al as an electrode 20 were sequentially deposited on the second ferromagnetic layer 15.

After the layers were patterned, interlayer dielectric layers and contact holes were formed, and Al interconnections serving as measurement electrodes were formed. Finally, the sample was annealed in a uniform magnetic field of 1 T at 270° C. for 1 hour.

The drain currents Id(P) and Id(AP) of the spin transistor 10 of this example formed following the above procedure were measured as follows.

First, after a gate voltage greater than or equal to a threshold voltage Vth was applied to the electrode 21, the magnetic field was swept, and the relative magnetization directions in the first and second ferromagnetic layers 14 and 15 were made almost parallel by spin transfer. Then, the drain current Id(P) was measured by applying a voltage between the electrodes 20 and 22. Subsequently, the relative magnetization directions in the first and second ferromagnetic layers 14 and 15 were made almost antiparallel by applying an external magnetic field. The drain current Id(AP) was measured by applying a voltage between the electrodes 20 and 22. In this case, the Id(P)/Id(AP) ratio was about 3.

As a comparative example, a spin transistor including a channel region having the same total channel width (i.e., the total width of the channel regions 13) as that of the spin transistor 10 formed in Example 1 was formed. The Id(P)/Id (AP) ratio of this comparative example was measured and found to be about 2. That is, dividing the channel region into a plurality of channel regions made it possible to suppress spin relaxation and increase the Id(P)/Id(AP) ratio.

Example 2

Figure 31:
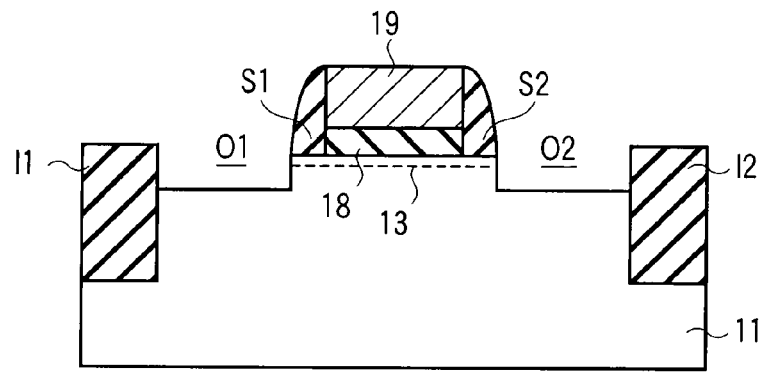
FIG. 31 is a sectional view illustrating a manufacturing step of the spin transistor 10 according to Example 2 of the present invention.
Figure 32:
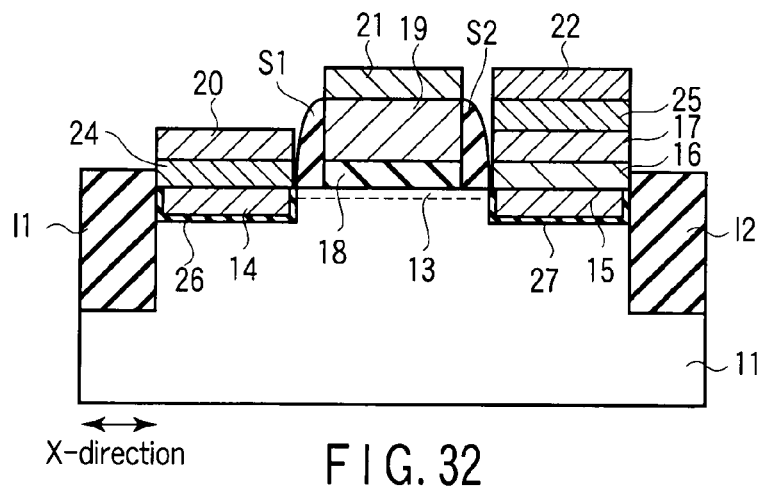
FIG. 32 is a sectional view illustrating a manufacturing step, which follows FIG. 31, of the spin transistor 10.

A practical example of the spin transistor 10 having a thin channel structure exemplified in the third embodiment will be explained below. In this example, a spin transistor was manufactured by adding antiferromagnetic layers 24 and 25 and tunnel barrier layers 26 and 27 to the spin transistor 10 having a thin channel structure exemplified in the third embodiment. FIGS. 31 and 32 are sectional views illustrating manufacturing steps of the spin transistor 10 according to Example 2.

As shown in FIG. 31, element isolation insulating layers 11 and 12 were formed in a silicon substrate 11 by using the conventional CMOS process. Then, mask layers made up of thin lines were formed on the silicon substrate 11, and an impurity is ion-implanted in the silicon substrate 11, thereby forming channel regions 13 in the silicon substrate 11.

Subsequently, a silicon oxide film serving as a gate insulating film 18 was grown on the surface of the silicon substrate 11 by thermal oxidation. Polysilicon serving as a gate electrode 19 was deposited on the gate insulating film 18. An impurity was ion-implanted in this polysilicon layer, and the sample was annealed.

The gate electrode 19 and gate insulating film 18 were patterned by photolithography and RIE. Sidewalls S1 and S2 made of $SiO_2$ were formed on the two side surfaces of the gate electrode 19 by using a self-alignment process.

The gate electrode 19 and sidewalls S1 and S2 were used as masks to form openings O1 and O2 as prospective regions of first and second ferromagnetic layers 14 and 15 in the silicon substrate 11 by RIE.

As shown in FIG. 32, $SiO_2$ layers serving as tunnel barrier layers 26 and 27 were respectively formed in the openings O1 and O2. Co—Fe (3 nm) and Ta (5 nm) serving as first and second ferromagnetic layers 14 and 15 were respectively deposited on the tunnel barrier layers 26 and 27.

After a region except for the first ferromagnetic layer 14 was protected by a resist layer, the Ta layer on the first ferromagnetic layer 14 was removed. Pt—Mn (20 nm) serving as an antiferromagnetic layer 24 and Al serving as an electrode 20 were sequentially deposited on the first ferromagnetic layer 14. After that, the Pt—Mn layer and Al layer in portions except for the necessary portion were removed. Note that a chamber for removing the Ta layer and a chamber for performing the Pt—Mn layer formation process were connected via a transfer chamber, so a sample could be moved while it was kept in a vacuum. Note also that the first ferromagnetic layer 14 and antiferromagnetic layer 24 are desirably formed by using a sputtering apparatus having a high directivity.

After a region except for the second ferromagnetic layer 15 was protected by a resist layer, the Ta layer on the second ferromagnetic layer 15 was removed. Then, Cu as a nonmagnetic layer 16, $Co_{90}Fe_{10}$ as a third ferromagnetic layer 17, Pt—Mn (20 nm) as an antiferromagnetic layer 25, and Al as an electrode 20 were sequentially deposited on the second ferromagnetic layer 15.

After the layers were patterned, interlayer dielectric layers and contact holes were formed, and Al interconnections serving as measurement electrodes were formed. Finally, the sample was annealed in a uniform magnetic field of 1 T at 270° C. for 1 hour.

The drain currents Id(P) and Id(AP) of the spin transistor 10 of this example formed following the above procedure were measured as follows.

First, after a gate voltage greater than or equal to a threshold voltage Vth was applied to the electrode 21, the magnetic field was swept, the relative magnetization directions in the first and second ferromagnetic layers 14 and 15 were made almost parallel, and the drain current Id(P) was measured. Subsequently, the relative magnetization directions in the first and second ferromagnetic layers 14 and 15 were made almost antiparallel, and the drain current Id(AP) was measured. In this case, the Id(P)/Id(AP) ratio was about 3.

Dividing the channel region into a plurality of channel regions made it possible to suppress spin relaxation and increase the Id(P)/Id(AP) ratio in this example as well.

Note that an integrated circuit may also be manufactured by using the spin transistors of the above embodiments. It is also possible to manufacture a reconfigurable logic circuit by using the spin transistors of the above embodiments. A reconfigurable logic circuit is a circuit capable of selecting one of logic levels by one logic circuit on the basis of program data.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A spin transistor comprising:
a first ferromagnetic layer provided on a substrate and having an invariable magnetization direction;
a second ferromagnetic layer provided on the substrate apart from the first ferromagnetic layer in a first direction, and having a variable magnetization direction;
a plurality of projecting semiconductor layers provided on the substrate to extend in the first direction, and sandwiched between the first ferromagnetic layer and the second ferromagnetic layer;
a plurality of channel regions respectively provided in the projecting semiconductor layers; and
a gate electrode provided on the channel regions.

2. The transistor according to claim 1, further comprising a gate insulating film provided between the gate electrode and the channel regions.

3. The transistor according to claim 1, wherein the gate electrode is made of a semiconductor having a conductivity type opposite to that of the channel region.

4. The transistor according to claim 1, further comprising an antiferromagnetic layer provided on the first ferromagnetic layer.

5. The transistor according to claim 1, further comprising:
a nonmagnetic layer provided on the second ferromagnetic layer; and
a third ferromagnetic layer provided on the nonmagnetic layer and having an invariable magnetization direction.

6. The transistor according to claim 5, further comprising an antiferromagnetic layer provided on the third ferromagnetic layer.

7. The transistor according to claim 1, further comprising a tunnel barrier layer provided in at least one of a portion between the first ferromagnetic layer and the channel regions, and a portion between the second ferromagnetic layer and the channel regions.

8. A spin transistor comprising:
a first ferromagnetic layer provided on a substrate and having an invariable magnetization direction;
a second ferromagnetic layer provided on the substrate apart from the first ferromagnetic layer in a first direction, and having a variable magnetization direction;
a plurality of semiconductor layers provided on the substrate to extend in the first direction, sandwiched between the first ferromagnetic layer and the second ferromagnetic layer, and having upper surfaces inclined in a direction perpendicular to the first direction;
a plurality of channel regions respectively provided in the semiconductor layers; and
a gate electrode provided on the channel regions.

9. The transistor according to claim 1, wherein each of the channel regions comprises a one-dimensional electron path.

10. The transistor according to claim 8, further comprising a gate insulating film provided between the gate electrode and the channel regions.

11. The transistor according to claim 8, wherein the gate electrode is made of a semiconductor having a conductivity type opposite to that of the channel region.

12. The transistor according to claim 8, further comprising an antiferromagnetic layer provided on the first ferromagnetic layer.

13. The transistor according to claim 8, further comprising:
a nonmagnetic layer provided on the second ferromagnetic layer; and
a third ferromagnetic layer provided on the nonmagnetic layer and having an invariable magnetization direction.

14. The transistor according to claim 13, further comprising an antiferromagnetic layer provided on the third ferromagnetic layer.

15. The transistor according to claim 8, further comprising a tunnel barrier layer provided in at least one of a portion between the first ferromagnetic layer and the channel regions, and a portion between the second ferromagnetic layer and the channel regions.

16. The transistor according to claim 8, wherein each of the channel regions comprises a one-dimensional electron path.

17. A spin transistor comprising:
a first ferromagnetic layer provided in a semiconductor substrate and having an invariable magnetization direction;
a second ferromagnetic layer provided in the semiconductor substrate apart from the first ferromagnetic layer in a first direction, and having a variable magnetization direction;
a plurality of channel regions provided to extend in the first direction in the semiconductor substrate between the first ferromagnetic layer and the second ferromagnetic layer; and
a gate electrode provided on the channel regions.

18. The transistor according to claim 17, further comprising a gate insulating film provided between the gate electrode and the channel regions.

19. The transistor according to claim 17, wherein the gate electrode is made of a semiconductor having a conductivity type opposite to that of the channel region.

20. The transistor according to claim 17, further comprising an antiferromagnetic layer provided on the first ferromagnetic layer.

21. The transistor according to claim 17, further comprising:
a nonmagnetic layer provided on the second ferromagnetic layer; and
a third ferromagnetic layer provided on the nonmagnetic layer and having an invariable magnetization direction.

22. The transistor according to claim 21, further comprising an antiferromagnetic layer provided on the third ferromagnetic layer.

23. The transistor according to claim 17, further comprising a tunnel barrier layer provided in at least one of a portion between the first ferromagnetic layer and the channel regions, and a portion between the second ferromagnetic layer and the channel regions.

24. The transistor according to claim 17, wherein each of the channel regions comprises a one-dimensional electron path.

25. A magnetic memory comprising a spin transistor, a first bit line, a second bit line, and a word line, the spin transistor including:

a first ferromagnetic layer provided on a substrate and having an invariable magnetization direction;

a second ferromagnetic layer provided on the substrate apart from the first ferromagnetic layer in a first direction, and having a variable magnetization direction;

a plurality of projecting semiconductor layers provided on the substrate to extend in the first direction, and sandwiched between the first ferromagnetic layer and the second ferromagnetic layer;

a plurality of channel regions respectively provided in the projecting semiconductor layers; and a gate electrode provided on the channel regions, wherein the first ferromagnetic layer is electrically connected to the first bit line, the second ferromagnetic layer is electrically connected to the second bit line, and the gate electrode is electrically connected to the word line.

26. The memory according to claim 25, further comprising a power supply circuit connected to the first bit line and the second bit line, and configured to supply a bidirectional write current to the spin transistor.

27. The memory according to claim 25, further comprising a sense amplifier connected to one of the first bit line and the second bit line, and configured to sense data of the spin transistor.

* * * * *